United States Patent [19]

Lee et al.

[11] Patent Number: 4,616,146

[45] Date of Patent: Oct. 7, 1986

[54] BI-CMOS DRIVER CIRCUIT

[75] Inventors: Shi-Chuan Lee, Del Mar, Calif.; Douglas W. Schucker, Mesa, Ariz.

[73] Assignee: Motorola, Inc., Schaumburg, Ill.

[21] Appl. No.: 647,216

[22] Filed: Sep. 4, 1984

[51] Int. Cl.[4] ................... H03K 19/01; H03K 19/082; H03K 19/094
[52] U.S. Cl. .................................. 307/446; 307/443; 307/451; 307/454; 307/570
[58] Field of Search ............... 307/443, 446, 451, 454, 307/475, 570, 270, 300

[56] References Cited

FOREIGN PATENT DOCUMENTS 0058958 1/1982 European Pat. Off. ............ 307/570
0099100 1/1984 European Pat. Off. ............ 307/570

OTHER PUBLICATIONS

Lin et al., "Complementary MOS-Bipolar Transistor Structure", *IEEE Trans. Electron Devices*, vol. ED-16, No. 11, Nov. 1969, pp. 945-951.

Primary Examiner—Stanley D. Miller
Assistant Examiner—D. R. Hudspeth
Attorney, Agent, or Firm—William E. Koch

[57] ABSTRACT

A BI-CMOS circuit is provided wherein an output terminal is coupled between an upper and lower NPN push-pull transistor. This provides high current drive capability along with no d.c. power dissipation. A P-channel device has a source and a drain connected to the collector and base, respectively, of the upper NPN transistor. An N-channel device has a source and drain connected to the base and collector, respectively, of the lower NPN transistor. The gates of the P-channel and N-channel devices are connected to an input terminal and provide a high impedance thereat. Additional N-channel devices are coupled between the bases of the upper and lower NPN transistors and a supply voltage terminal for improving the switching speed of the output signal.

2 Claims, 4 Drawing Figures

BI-CMOS DRIVER CIRCUIT

BACKGROUND OF THE INVENTION

1. Field of the Invention

This invention relates in general to a semiconductor integrated driver circuit and, more particularly, to a BI-CMOS driver circuit having the low power dissipation, high input impedance, and high noise immunity of CMOS devices while maintaining the high drive capability associated with bipolar devices.

2. Background Art

Increased semiconductor technology has provided for the ability to fabricate a large number of semiconductor devices on one single chip. Bipolar circuits typically provide fast gate speeds, reduced delay per unit load, and have historically been the predominate technology applied in integrated circuits. CMOS (complementary metal-oxide-semiconductor) structures provide high noise immunity, high input impedance, and low power requirements, and have rapidly gained acceptance in the industry. However, a large CMOS structure is required when driving large capacitive loads and in most cases, several stages of scaled CMOS inverters are necessary in order to minimize the total delay. For CMOS arrays having a large number of devices, it is desirable that each device be of small size. As the size of a MOS device is reduced, the transconductance of the device and consequently the ability to drive a heavy capacitive load is also reduced. Bipolar devices continue to be used for driving these capacitive loads due to their high current gain. In quiesent periods, the bipolar push-pull transistors do not dissipate power. During transient periods, the bipolar current gain allows faster charging and discharging of capacitive loads. This results in a significant decrease in metal and fanout delays. Furthermore, smaller CMOS devices may be used in the BI-CMOS circuit than those required in an all CMOS device circuit. Attempts to combine bipolar and MOS technology to achieve all of these results have met with limited success.

One previously known circuit combining bipolar and MOS devices comprises a pair of push-pull NPN transistors. The upper NPN transistor has a collector connected to a first voltage source and the source of a P-channel device, an emitter connected to an output terminal and the collector of the lower NPN transistor, and a base connected to an input terminal and the gates of the P-channel device and an N-channel device. The emitter of the lower NPN transistor is connected to a second voltage source and the source of the N-channel device, and a base connected to the drains of the P-channel and the N-channel devices. However, this circuit has a low impedance at the input terminal since the input terminal is connected to the base of the upper NPN transistor, and as the output switches from low to high, the lower transistor is slow to turn off causing a slow transition to the high output.

Thus, what is needed is an integrated circuit combining CMOS and bipolar technology having a high input impedance, improved switching characteristics, low power requirements, and high noise immunity.

SUMMARY OF THE INVENTION

Accordingly, it is an object of the present invention to provide an improved BI-CMOS driver circuit.

Another object of the present invention is to provide a BI-CMOS circuit having improved output signal switching characteristics.

A further object of the present invention is to provide a BI-CMOS circuit having a high input impedance.

Still another object of the present invention is to provide a BI-CMOS circuit having low power requirements.

In carrying out the above and other objects of the invention in one form, there is provided a BI-CMOS circuit comprising an upper and a lower NPN push-pull output transistor having an output terminal coupled therebetween. A P-channel device has a source and a drain connected to the collector and base, respectively, of the upper transistor. An N-channel device has a source and drain connected to the base and collector, respectively, of the lower transistor. The gates of the P-channel and N-channel devices are connected to an input terminal.

The above and other objects, features, and advantages of the present invention will be better understood from the following detailed description taken in conjunction with the accompanying drawings.

DETAILED DESCRIPTION OF THE INVENTION

Figure 1:
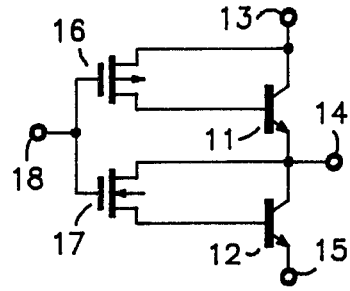
FIG. 1 is a schematic of one embodiment of the present invention.

Referring to FIG. 1, a circuit in accordance with the present invention is shown which is suitable to be fabricated in monolithic integrated circuit form. NPN transistors 11 and 12 comprise a pair of push-pull output transistors. Transistor 11 has its collector and emitter connected, respectively, to supply voltage terminal 13 and output terminal 14. Transistor 12 has its collector and emitter connected, respectively, to output terminal 14 and supply voltage 15. Supply voltage terminal 15 is typically ground. P-channel MOS transistor 16 has its source and drain connected, respectively, to supply voltage terminal 13 and the base of transistor 11. N-channel MOS transistor 17 has its drain and source connected, respectively, to output terminal 14 and the base of transistor 12. The gates of transistors 16 and 17 are connected to input terminal 18.

When a digital high signal is applied to input terminal 18, transistors 16 and 11 will be rendered non-conductive, thereby precluding the voltage on supply voltage terminal 13 from appearing on output terminal 14. Transistors 17 and 12 will be enabled, thereby ensuring output terminal 14 will be pulled toward the potential of terminal 15. Input terminal 18 will have a high impedance since it is connected only to the gates of MOS transistors 16 and 17. Output terminal 14 will have the high current characteristics of the bipolar push-pull transistors, thereby reducing the delays associated with the long metal lines on an integrated circuit and the fan out to a number of devices which all contribute to the parasitic capacitance load on terminal 14.

Figure 2:
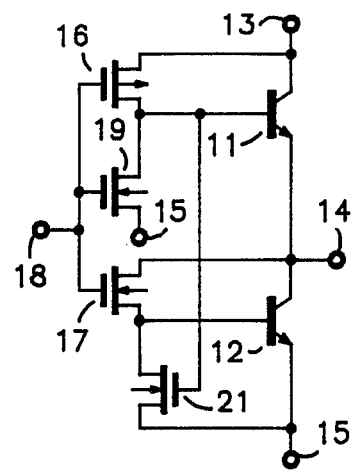
FIG. 2 is a schematic of the preferred embodiment of the present invention.

Referring now to FIG. 2, the preferred embodiment of the present invention is shown and comprises push-pull transistors 11 and 12, supply voltage terminals 13 and 15, output terminal 14, MOS transistors 16 and 17, and input terminal 18, all connected and numbered similar to the circuit shown in FIG. 1. N-channel MOS transistor 19 has its drain connected to the base of transistor 11, its source connected to supply voltage terminal 15, and its gate connected to input terminal 18. N-channel MOS transistor 21 has its drain connected to the base of transistor 12, its source connected to supply voltage terminal 15, and its gate connected to the base of transistor 11.

When a digital high signal is applied to input terminal 18, transistor 19 will be enabled thereby pulling the base of transistor 11 down, thus ensuring a more rapid transition of transistor 11 to an off state. A digital low signal at input signal 18 will enable only transistor 16. Enabled transistor 16 will apply the potential at terminal 13 to the base of transistor 11 and the gate of transistor 21. Transistor 21 will pull the base of transistor 12 low, thereby increasing the transition of transistor 12 to an off state.

Figure 3:
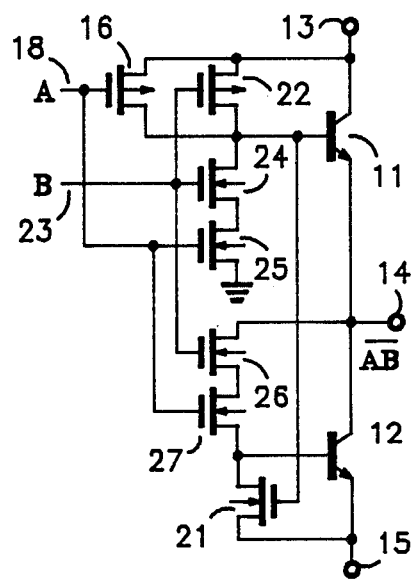
FIG. 3 is a schematic of a NAND gate incorporating the preferred embodiment.

Referring now to FIG. 3, a NAND gate employing the present invention is shown and comprises push-pull transistors 11 and 12, supply voltage terminals 13 and 15, output terminal 14, MOS transistors 16 and 21 and input terminal 18, all connected and numbered similar to the circuit shown in FIG. 2. P-channel MOS transistor 22 has its source connected to supply voltage terminal 13, its drain connected to the base of transistor 11, and its gate connected to input terminal 23. N-channel MOS transistor 24 has its drain connected to the base of transistor 11, its gate connected to input terminal 23, and its source connected to the drain of N-channel MOS transistor 25. Transistor 25 has its gate connected to input terminal 18 and its source connected to supply voltage terminal 15. N-channel MOS transistor 26 has its drain connected to output terminal 14, its gate connected to input terminal 23, and its source connected to the drain of N-channel MOS transistor 27. Transistor 27 has its gate connected to input terminal 18 and its source connected to the base of transistor 12.

It may be seen that input terminals 18 and 23 are connected only to the gates of MOS transistors, thereby giving a high impedance at input terminals 18 and 23, while a high current capability is maintained by push-pull NPN transistors 11 and 12. When digital high signals are applied to both input terminals 18 and 23, transistors 16, 22, and 11 are not enabled, thereby preventing the voltage on supply voltage terminal 13 from being applied to output terminal 14. Transistors 26, 27 and 12 are enabled, ensuring that output terminal 14 is grounded. Note that transistors 24 and 25 are enabled thereby holding the base of transistor 11 low and insuring that it remains non-conductive. In a like manner, when a digital low signal is applied to either or both of input terminals 18 and 23, output terminal 14 rises substantially to the voltage on supply voltage terminal 13.

When output terminal 14 goes high (transistor 11 conducting), transistor 21 becomes enabled by the same bias applied to the base of transistor 11 thereby pulling current away from the base of transistor 12, and thus improving the switching speed of the output voltage. When output terminal 14 is low, input terminals 18 and 23 will have had a digital high signal applied thereto, rendering transistors 24, 25, 26, and 27 conductive. Transistors 24 and 25 direct current away from the base of transistor 11, and transistors 26 and 27 direct current to the base of transistor 12, thereby providing for a faster transition of the output signal.

Figure 4:
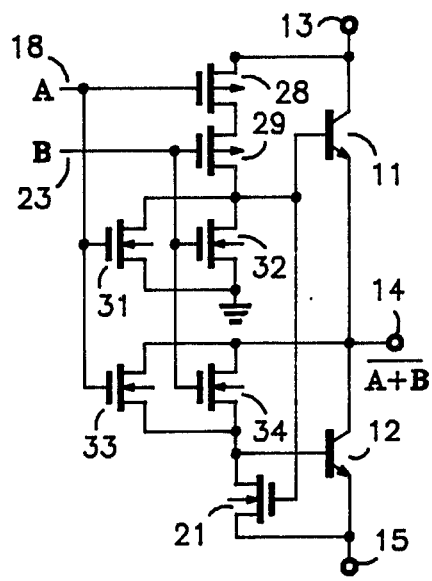
FIG. 4 is a schematic of a NOR gate incorporating the preferred embodiment.

Referring now to FIG. 4, a NOR gate employing the present invention is shown and comprises push-pull transistors 11 and 12, supply voltage terminals 13 and 15, output terminal 14, input terminals 18 and 23, and MOS transistor 21, all connected and numbered similar to the circuit shown in FIG. 3. P-channel MOS transistor 28 has its source connected to supply voltage terminal 13, its gate connected to input terminal 18, and its drain connected to the source of P-channel MOS transistor 29. The gate of transistor 29 is connected to input terminal 23 and its drain is connected to the base of transistor 11. N-channel MOS transistors 31 and 32 have their drains connected to the base of transistor 11, and their sources connected to supply voltage terminal 15. The gates of transistors 31 and 32 are connected to input terminals 18 and 23, respectively. N-channel MOS transistors 33 and 34 have their drains connected to output terminal 14, their sources connected to the base of transistor 12, and their gates connected to input terminals 18 and 23, respectively.

It is seen that input terminals 18 and 23 are connected only to the gates of MOS transistors, thereby giving a high impedance at input terminals 18 and 23, while a high current capability is maintained by push-pull NPN transistors 11 and 12. When digital low signals are applied to input terminals 18 and 23, transistors 28, 29, and 11 are enabled, thereby providing voltage from supply voltage terminal 13 to output terminal 14. Transistors 33 and 34 are not enabled, thereby preventing the voltage on output terminal 14 from going to supply voltage terminal 15. When output terminal 14 goes high, transistor 21 conducts due to the voltage supplied by transistors 28 and 29, providing for a rapid transition of the output signal by pulling base drive from transistor 12. When a digital high signal is applied to one or both of input terminals 18 and 23, one or both of transistors 28 and 29 will become nonconductive, turning transistor 11 off, and one or both of transistors 33 and 34 will become conductive, turning transistor 12 on. When output terminal 14 goes low, one or both of transistors 31 and 32 will have become conductive, pulling base drive from transistor 11, and providing for a rapid transition of the output signal.

Although the circuits described herein illustrate NPN transistors, P-channel transistors, and N-channel transistors, various combinations of PNP transistors and MOS transistors may be used in a manner known to those skilled in the art in order to accomplish the teachings of this invention. Furthermore, although only a NAND gate and a NOR gate have been described, the invention may also be used to enhance other types of gates, flip-flops and the like.

The invention described herein can be used for internal circuits to improve Very Large Scale Integration (VLSI) performance as well output drivers. In a gate array or standard cell based VLSI, the device size is uniform for ease of physical design. As a result, the delay degradation per unit load for CMOS is generally different for different circuit functions due to the difference in output impedance of various circuit configurations. For the invention described herein, the unit load degradation is practically the same for all circuit functions because the bipolar push-pull transistors isolate the CMOS circuits from the loading. This leads to ease of applications in semi-custom environments. The bipolar transistors also make ECL input/output (i.e., high performance RAM's) much easier to achieve. The invention can also be used in word line drivers, bit line drivers and sense amplifiers to improve performance.

Another application is a gate array with mixed TTL and ECL input/output on the same chip. This feature is desirable in high performance disk drives, test systems and high speed graphics applications.

By now it should be appreciated that there has been provided a BI-CMOS circuit having improved output voltage switching speed, low power requirements, high input impedance, and high current output capability.

We claim:

1. A gate circuit comprising:
   a plurality of input terminals;
   an output terminal;
   a first bipolar transistor having its emitter-collector current path coupled between a first supply voltage terminal and said output terminal;
   a second bipolar transistor having its emitter-collector current path coupled between said output terminal and a second supply voltage terminal;
   a first plurality of MOS transistors, each having its drain-source current path coupled in parallel between said first supply voltage terminal and a base of said first bipolar transistor, each of said first plurality of MOS transistors having a control electrode coupled to one of said plurality of input terminals;
   a second plurality of MOS transistors, each having its drain-source current path coupled in series between said output terminal and a base of said second bipolar transistor, each of said second plurality of MOS transistors having a control electrode coupled to one of said plurality of input terminals;
   a third plurality of MOS transistors, each having its drain-source current path coupled in series between said base of said first bipolar transistor and said second supply voltage terminal, and having a control electrode coupled to one of said plurality of input terminals; and
   a first MOS transistor having its drain-source current path coupled between said base of said second bipolar transistor and said second supply voltage terminal, and having a control electrode coupled to said base of said first bipolar transistor.

2. A gate circuit comprising:
   a plurality of input terminals;
   an output terminal;
   a first bipolar transistor having its emitter-collector current path coupled between a first supply voltage terminal and said output terminal;
   a second bipolar transistor having its emitter-collector current path coupled between said output terminal and a second supply voltage terminal;
   a first plurality of MOS transistors, each having its drain-source current path coupled in series between said first supply voltage terminal and a base of said first bipolar transistor, each of said first plurality of MOS transistors having a control electrode coupled to one of said plurality of input terminals;
   a second plurality of MOS transistors, each having its drain-source current path coupled in parallel between said output terminal and a base of said second bipolar transistor, each of said second plurality of MOS transistors having a control electrode coupled to one of said plurality of input terminals;
   a third plurality of MOS transistors, each having its drain-source current path coupled in parallel between said base of said first bipolar transistor and said second supply voltage terminal, each of said third plurality of MOS transistors having a control electrode coupled to one of said plurality of input terminals; and
   a MOS transistor having its drain-source current path coupled between said base of said second bipolar transistor and said second supply voltage terminal, and having a control electrode coupled to said base of said first bipolar transistor.

* * * * *